United States Patent [19]

Georgiou et al.

[11] Patent Number: 4,633,394
[45] Date of Patent: Dec. 30, 1986

[54] DISTRIBUTED ARBITRATION FOR MULTIPLE PROCESSORS

[75] Inventors: Christos J. Georgiou, White Plains, N.Y.; Anders P. Ravn, Lyngby, Denmark

[73] Assignee: International Business Machines Corp., Armonk, N.Y.

[21] Appl. No.: 603,276

[22] Filed: Apr. 24, 1984

[51] Int. Cl.[4] .............................................. G06F 9/46
[52] U.S. Cl. ................................. 364/200; 340/825.51
[58] Field of Search ... 364/200 MS File, 900 MS File; 340/825.5, 825.51

[56] References Cited

U.S. PATENT DOCUMENTS

| | | | |
|---|---|---|---|
| 3,593,300 | 7/1971 | Driscoll | 364/200 |
| 3,959,775 | 5/1976 | Valassis | 364/200 |
| 4,096,571 | 6/1978 | Van der Hey | 364/200 |
| 4,096,572 | 6/1978 | Namimoto | 364/200 |
| 4,151,592 | 4/1979 | Suzuki | 364/200 |
| 4,257,095 | 3/1981 | Nadir | 364/200 |
| 4,268,904 | 5/1981 | Suzuki | 364/200 |
| 4,281,381 | 7/1981 | Ahuja et al. | 364/200 |
| 4,320,455 | 3/1982 | Woods | 364/200 |
| 4,378,588 | 3/1983 | Katzman et al. | 364/200 |
| 4,414,624 | 11/1983 | Summer | 364/200 |

Primary Examiner—David Y. Eng

[57] ABSTRACT

A method of arbitrating for N processors requesting access to a shared resource utilizing 2 $\log_2 N$ shared variables, such as electrical lines. Each processor can assert a line which is asserted if any processor is asserting it. A requesting processor asserts one of two lines for each bit of a unique processor address, the choice of line depending on the value of the bit. The processor then examines the non-asserted line to determine if it is asserted by another processor. If the other line is asserted, the requesting processor either releases its own asserted line or waits depending on the value of the address bit. Thus, priority is determined by the address values. Once a processor has successfully asserted lines for every bit of its address it is granted access.

Arbitration with fairness can be obtained by dividing processors into two fairness groups and assigning a turn to one of the groups. A processor is allowed into arbitration if the turn belongs to its fairness group. Upon completing access, the processor is assigned to the other fairness group. The turn is changed when no processor of that fairness group is requesting access.

18 Claims, 6 Drawing Figures

4,633,394

DISTRIBUTED ARBITRATION FOR MULTIPLE PROCESSORS

DESCRIPTION

1. Technical Field

This invention relates to arbitration for a multi-processor system. In particular, it relates to an arbitration scheme completely distributed to the processors and using a minimum number of synchronization variables such as interconnection lines or memory locations.

2. Background of the Invention

Most computers and processor-controlled equipment are built with a single processor controlling the processing and determining the use of resources associated with the system. All control is centralized in the processor and its associated software so that the use of a system resource is uniquely determined. However, with the advent of small, inexpensive processing circuitry, often integrated onto a single-chip processor, many systems have been designed which use multiple processors. A multiple-processor system offers the advantages of high speed because each of the processors can be operating its own task independently of the other processors in the system. The parallel processing potentially offers an increase in speed equal to the number of processors.

Multi-processor systems can also provide increased reliability because, with proper design, the failure of one of the processors does not affect the operation of the remaining non-failing processors and the system can continue operation although with degraded performance. It is also possible for the individual processors to have specialized capabilities, such as handling I/O or performing floating-point calculations, which would be unnecessarily duplicated in all the processors in the system.

The advantage of a multi-processor system rests in the relative independence of operation of the separate processors since there is no centralized processor closely controlling every step of the multi-processors. If there were such centralized control, the speed of the system would be determined by the speed of the central processor and its failure would cripple the entire system. Also implicit in the design of a multi-processor system is the fact that some resources of the system are shared between the processors. This shared resource may be a memory or a peripheral I/O device. The memory needs to be shared because the processors are likely to be acting upon a common pool of data or software. The memory sharing may be either of the physical memory locations or of the contents of memory. For instance, each processor may have a local memory which contains information relating to the system as a whole, such as the state of interconnections through a common cross-point switch. This information is duplicated in the local memory of each processor. When these local memories are to be updated together, the processors must agree among themselves which processor is to update the common information in all the local memories. The I/O devices are shared because of the complexity and expense associated with separate I/O devices attached to each of the processors. An even more fundamental shared resource is the bus connecting the processors to the shared resources as well as to each other. Two processors cannot be simultaneously using the same bus except in the unlikely occurrence that each processor is simultaneously requiring the input of the same information.

This combination of independently operating multi-processors and shared resources means that the request for a shared resource occurs at unpredictable times and that there is a likelihood that two processors will simultaneously need the same shared resource. If more than one request is made or is outstanding at any time for a particular shared resource, conflict resolution must be provided which will select the request of one processor and refuse the request of the others. Means must also be provided for assuring that a refused request is eventually honored.

Conceptually, the simplest type of arbitration is performed by a centralized arbiter and this type of system is very common in computer systems built around a shared bus. An example of a centralized arbiter is disclosed by Nadir in U.S. Pat. No. 4,257,095. Whenever a processor needs a resource, it notifies a priority circuit of its request. It is only when the priority circuit honors the request that the individual processor is allowed access to the requested resource. Centralized arbiters can provide fast arbitration and can usually be implemented with moderate hardware complexity. The result of the arbitration depends upon the design of the arbitration circuit or software. The arbitration may be strictly in terms of priority according to which a task or a processor of higher priority always has precedence over a lower priority request. This scheme may be modified to allow the completion of an already existing connection to the shared resource before the highest priority request is granted access to that resource. Centralized priority arbiters have been described in the prior art, such as by Valassis et al. in U.S. Pat. No. 3,959,775, by Namimoto in U.S. Pat. No. 4,096,572 and Suzuki et al. in U.S. Pat. Nos. 4,151,592 and 4,268,904. Alternatively, the arbitration may be performed on a first-come, first-serve basis where the requests are arranged in the order in which they have been made and are sequentially serviced. This sequencing amounts to a queue for the resource. Woods et al. in U.S. Pat. No. 4,320,455 disclose the software required for creating and servicing a queue for multiple processors seeking a shared resource. Ahuja et al. in U.S. Pat. No. 4,281,381 describe the circuitry of a first-come, first-serve centralized arbiter.

The choice between priority or first-come, first-serve arbitration is unsatisfactory. In a heavily loaded system with priority arbitraton, the highest priority processor will preempt the lower priority processors, thus preventing their accessing the resource during the heavy use period. On the other hand, first-come, first-serve arbitration allows no prioritization between processors. The same objection applies to round-robin arbitration in which the processors are sequentially polled for an outstanding request.

Centralized arbiters suffer the disadvantage that such centralized control runs counter to the desired distributed control in a multi-processor system. The centralized arbitraton circuitry is a special circuit apart from the duplicated processors and thus introduces additional circuits into an otherwise symmetrical system. The centralized control is also subject to single point failure which would disrupt the entire multi-processor system.

An alternative to centralized arbitration is distributed arbitration in which the arbitration for a processor requesting access to a shared resource is performed by that processor. Distributed arbitration requires synchronization variables, such as memory locations accessible by each processor or control lines between the processors. An example of a distributed arbitration scheme is described by Vander Mey in U.S. Pat. No. 4,096,571 in which a priority bus links the different processors and each line of the bus indicates a processor requesting access to the shared resource. Distributed arbitration schemes have mostly been discussed for implementation in software systems. They offer significantly better fault-tolerance than centralized systems. However, prior art distributed arbitration schemes are limited by drawbacks such as slowness of operation encountered in schemes which involve synchronization messages or time-outs to establish priority in local area networks and also by the large component requirements of previously known systems. Many of these systems are not suitable for hardware arbiters where fast arbitration among a large number of competing processors is required.

Dijkstra and Lamport have both provided theoretical justification for the rule that distributed arbitration can be implemented for N processors with the number of shared variables, such as memory locations or control lines, of the order of N. This number of interconnecting control lines appears in the previously described patent to Vander Mey and also in a distributed control scheme disclosed by Discroll and Mullery in U.S. Pat. No. 3,593,300. The drawback of the large component requirements for the implementation of shared variables is not significant for classical processors built around a shared memory, where the synchronization variables are memory locations, typically an abundant resource. However, when the synchronization variable is a special component, such as control lines, this requirement becomes of greater concern. The concern is heightened when a very large number of processors are to be included in a multiprocessor system. The number of required interconnection lines becomes large enough to pose a design constraint upon the system.

SUMMARY OF THE INVENTION

Accordingly, the present invention seeks to provide a fast and fault tolerant distributed arbitration for a multi-processor system.

The invention also seeks to provide distributed arbitration with a minimum number of shared variables.

The invention further seeks to provide distributed arbitration that combines priority and first-come, first-serve arbitration.

The invention can be summarized as a distributed arbitraton scheme for N processors in which 2 $\log_2 N$ shared variables, such as synchronization lines, carry the addresses on one set of binary lines and the complement of the addresses on another set of binary lines. Each of the processors can assert a state on each of the shared variables and any processor so asserting that one state causes the variable to assume that state rather than the unasserted state. This can be accomplished, for example, by an open-collector output to a line.

The processor requesting access sequentially asserts the bit lines of its own address and its complemented address according to its own identification. It then looks at the complementary line to the one it asserted to determine if another processor is requesting access. In case of conflict, the arbitration scheme determines that the processor with the lower address has priority for the resource.

An additional fairness-in-arbitration feature is implemented by means of four additional shared variables. As soon as a processor is serviced, it places itself into a group representing the most recently serviced processors. These processors cannot be again serviced until all other processors waiting to be serviced have had their turn.

DETAILED DESCRIPTION OF THE PREFERRED EMBODIMENTS

Figure 1:
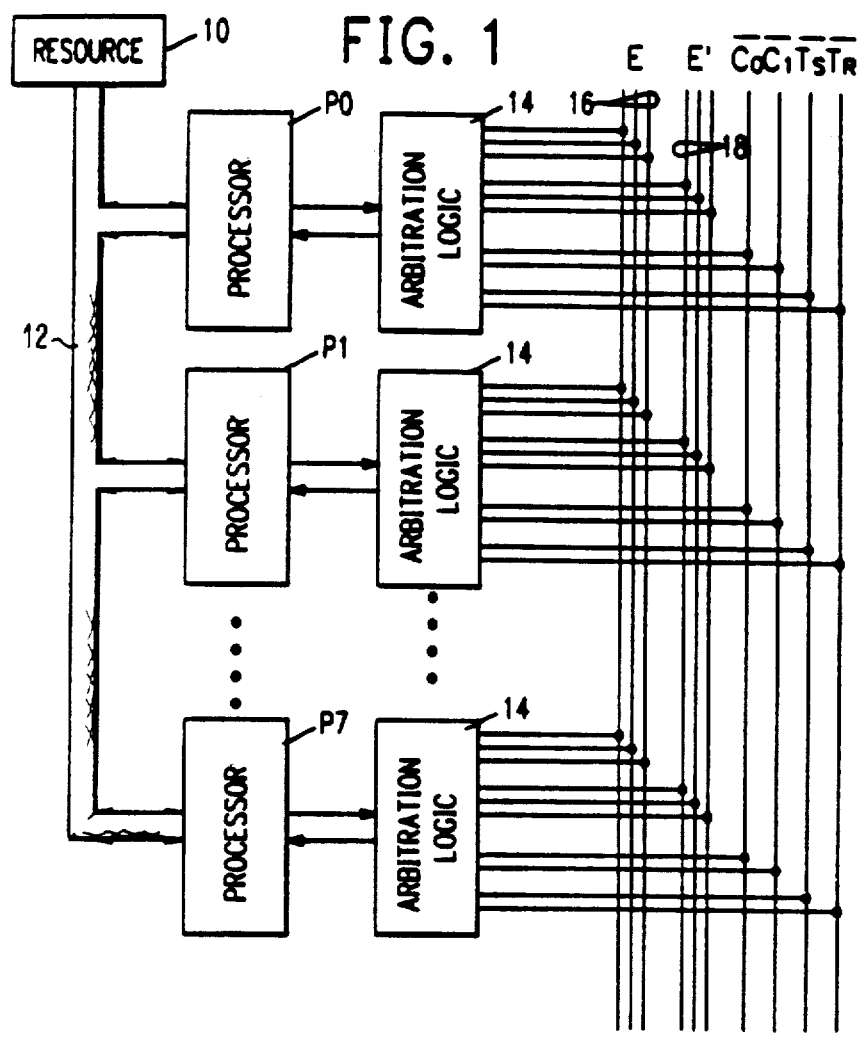
FIG. 1 is a schematic diagram of a multi-processor system including the lines necessary for the arbitration with fairness of this invention.

A multi-processor system is illustrated in FIG. 1 for eight processors $P_0-P_7$. All the processors share a common resource 10 and a bus 12 connecting each of the processors $P_0-P_7$ to the resource 10. The resource 10 may be a memory, an input-output device or another type of device. Alternatively, the shared resource may be the bus 12 being used for communication between the processors $P_0-P_7$. The important point is that only one of the processors $P_0-P_7$ can obtain access to the shared resource 10 at any time. If multiple processors concurrently require access to the resource 10, then a distributed arbitration circuit determines which of the requesting processors obtains access.

The arbitration circuitry comprises identical arbitration logic circuits 14 attached to each of the processors $P_0-P_7$ and a bus 16 for the true address E and a bus 18 for the complemented address E'. Each of these address buses 16 and 18 contain sufficient lines to represent the binary address of each of the processors $P_0-P_7$. In the given example, there are eight processors so that each of the address buses 16 and 18 contain three lines. In the general case of N processors, each of the address buses 16 and 18 contain $\log_2 N$ lines where $\log_2 N$ is rounded up to the next integer if necessary.

Every line of both address buses 16 and 18 is connected to each of the arbitration logic circuits 14. In general, the arbitration logic circuits can both read the individual lines and individually assert the lines. The signals on the individual lines can be either asserted or non-asserted. If any of the arbitration logic circuits 14 is asserting the bus line to which it is connected, that line assumes an asserted state. On the other hand, if no arbitration logic circuit 14 is asserting the particular bus line, that bus line assumes the non-asserted state.

Figure 2:
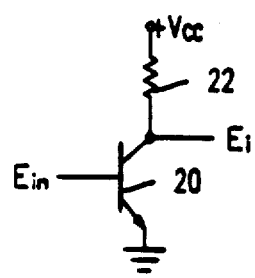
FIG. 2 is a schematic diagram of an open-collector output circuit.

Such an assertion circuit can be realized by using open-collector outputs from the arbitration logic circuit. An open collector output is illustrated in FIG. 2 and consists of a transistor 20 whose emitter is connected to ground and whose collector is separated from a voltage supply $V_{cc}$ by a resistor 22. The output $E_i$ is connected to the collector of the transistor 20 and a signal $E_{in}$ drives the base of the transistor 20. When $E_{in}$ is high or 1, the transistor is in a low impedance state so that the output $E_i$ is low or 0. On the other hand, when the input $E_{in}$ is low, the transistor 20 presents a high impedance with the result that the output $E_i$ floats high to the value of the voltage supply $+V_{cc}$. However, if another open-collector output is pulling $E_i$ low, that is providing an open path to ground, then the voltage on the collector of this transistor 20 is also low, regardless of the value of $E_{in}$. For the purposes of this invention, any open-collector output attached to a bus line can assert a low or 0 value on the bus line and the bus line will go low, regardless of the values of the other inputs. If no open-collector output is asserting a low value, then the bus line is high. Thus assertion is associated with a low or 0 value, while a non-asserted line is high or 1. If one of the lines of the true address bus 16 is designated as $E_i$, the signal on that line will be represented as $S(E_i)$. There will be N lines connected to $E_i$. These individual connecting lines from the separate arbitration logic circuits will be designated as $E_{ij}$. Then $S(E_i)=0$ if any of the $E_{ij}$ are asserted, that is, any $E_{ij}=0$. On the other hand, $S(E_i)=1$ if all $E_{ij}$ are non-asserted, that is, all $E_{ij}=1$. It is to be further noted that the open-collector output is an inverting output between its input $E_{in}$ and its output $E_i$.

Each of the processors $P_0$–$P_7$ is assigned a unique three-bit address, $A=(a_2, a_1, a_0)$. If the addresses correspond to the processor designations shown in FIG. 1, then the address of the processor $P_0$ is $A_0=(000)$, that of $P_1$ is $A_1=(001)$, etc. Each bit of the binary address identifies one of two bit value groups for the processor, that is group 0 or group 1. The two groups are represented by separate bus lines $E_i$ and $E'_i$. A processor value having a value of 0 in the i-th bit of its address belongs to bit value group 0 and its group wire is $E'_i$. Similarly, a value of 1 puts the processor in bit value group 1 and its wire is $E_i$. The two bit value groups are complementary to each other as are the wires $E_i$ and $E'_i$. The processors can assert the state of their own group on their own group wire $E_i$ and $E'_i$ for the particular bit but the processors can only read the state of the wire for the complementary group.

The arbitration scheme of the invention works in the following manner. Tha arbitration logic 14 of each processor sequentially operates on the variables corresponding to each of the three address bits $a_2, a_1, a_0$. The arbiration logic 14 first asserts the bus line corresponding to the processor's bit value group for the particular bit. After waiting for the signal to propagate to all processors, the arbitration logic 14 examines the complementary group's wire. If it finds the complementary group's wire to be asserted, it initiates a conflict resolution procedure. Otherwise, the next variable or bit in the address sequence is operated upon. For example, the $P_1$ processor has an address $A_1=(001)$. Its associated arbitration logic determines that the first bit $a_2$ puts the processor into the bit value group 0. It then asserts the group 0 bus line for that bit, i.e. $E'_2$. After a propagation delay, the arbitration logic 14 then examines the complementary group wire for that bit, i.e. $E_2$. If $E_2$ is asserted, the arbitration logic 14 initiates the conflict resolution procedure. If $E_2$ is not asserted, the next variable in sequence $a_1$ is operated upon by asserting $E'_1$ and examining $E_1$. However, for the last address bit $a_0$, the bit value group is group 1 so that $E_0$ is asserted and $E'_0$ is examined.

If the arbitration logic 14 associated with a processor requesting access has asserted a group wire for which the corresponding complementary group wire is already asserted, the conflict is resolved by a fixed priority conflict resolution in the following manner. The bit value group 0 always has a higher priority. This means that the arbitration logic 14 associated with the group 0 processor will keep its group wires asserted but will not move onto to the next variable or address bit until the group 1 wire for that bit is released. On the other hand, the arbitration logic 14 for a group 1 processor must immediately release the last asserted group wire and is not allowed to assert it again until the group 0 wire for that bit is released. Once the arbitration logic 14 has successfully asserted all three of its proper group wires without conflict, with any conflict resolved in its favor, or with the conflicting group wire having been released, the arbitration logic 14 signals its processor that it has obtained access to a desired resource.

The effect of this fixed arbitration scheme is that the processor with the lowest address is given priority to the resource over any other processor of a higher address simultaneously requesting the resource or waiting for access to that resource. For example, if the processor $P_2$ currently has access to the resource, its associated arbitration logic 14 has asserted the group wires $E'_2$, $E_1$ and $E'_0$. If then the $P_1$ processor requests access, its associated arbitration successfully asserts $E'_2$ without conflict. However, after it asserts $E'_1$, it discovers that $E_1$ is already asserted. According to the rule that a bit value group of 0 has priority, the arbitration logic 14 associated with the $P_1$ processor does not release the group wire $E'_1$, but continues asserting it and waits for $E_1$ to be released before proceeding to its third address bit $a_0$. However, if the processor $P_4$ with an address $A_4=(100)$ requests access, when its associated arbitration logic 14 asserts $E_2$, it determines that $E'_2$ is already asserted by both $P_1$ and $P_2$. According to the conflict resolution rules, the arbitration logic 14 of $P_4$ must then release $E_2$ until $E'_2$ is released by both $P_2$ and then by $P_1$. If after all the foregoing has occurred, the processor $P_0$ request access, its associated arbitration logic 14 successfully asserts $E'_2$ because $E_2$ has not remained asserted. It then asserts $E'_1$ despite the conflict with $E_1$ produced by $P_2$ because of the priority of bit group 0. However, $P_4$ cannot proceed to asserting its third address bit $a_0$ until $P_2$ releases $E_1$. Thus it is seen that $P_0$ has been placed ahead of the earlier request from $P_4$ and is placed in a tie with $P_1$.

After a processor has finished accessing the common resource, it exits the arbitration process by releasing all of its group wires in an arbitrary order. The remaining processors attempting to gain access to that resource can then proceed with the changed conditions on the bus lines 16 and 18.

Figure 3:
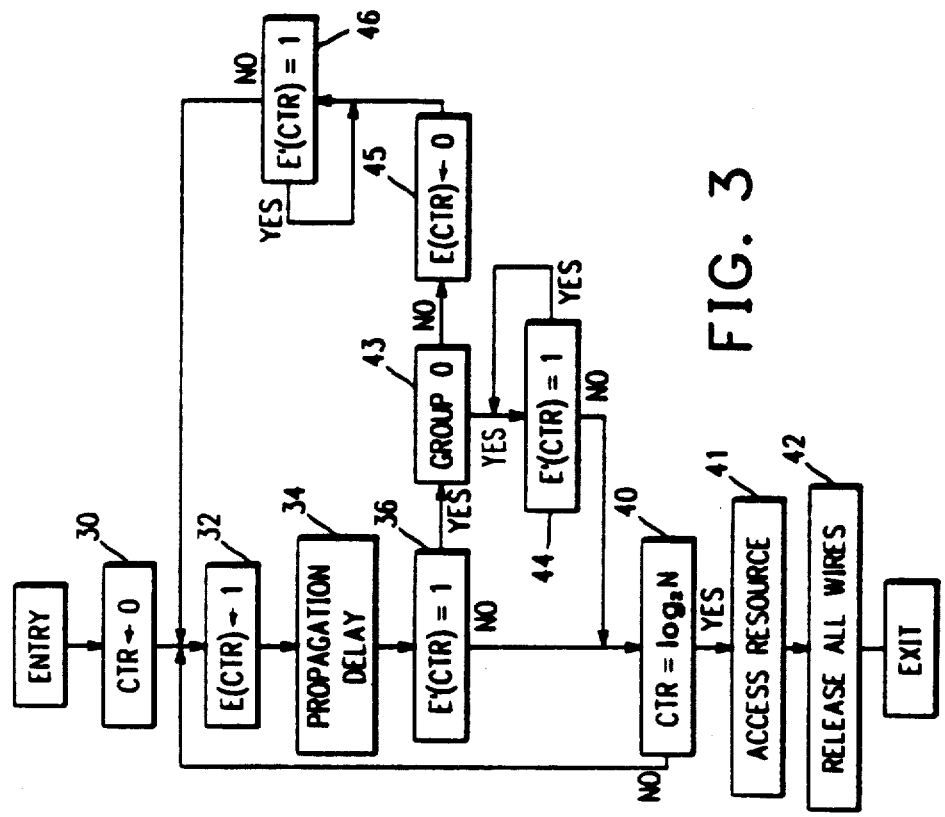
FIG. 3 is a flow diagram of the fixed priority arbitration scheme of this invention.

FIG. 3 is a flow diagram that the arbitration logic follows in the fixed priority arbitration scheme. A counter is used to sequentially operate upon the bits of the address. In an initial step 30, the counter is set to CTR=0. One of the group wires pointed to by the counter is then asserted in step 32. Whether the asserted group wire is on the true address bus 16 or the complementary address bus 18 depends upon the value of the bit pointed to by the counter. In FIG. 3, an asserted state is a logical 1. Then after a propagation delay 34, a test 36 is made to determine if the bus line complementary to the line set in step 32 is asserted. If the tested bus line is not asserted, the counter is incremented in step 38 and a test 40 is made on the incremented counter to determine if all address bits have been asserted and successfully tested. If not, the above steps are repeated.

If all address bits have been successfully asserted, the processor gains access 41 to the resource and after its task has been completed, it performs a release 42 of all the wires asserted in step 32.

If, however, in step 36 the complementary group wire is determined to be asserted, a test 43 is made to determine if the bit value group for the recently asserted bit is group 0, that is, the high priority group so that E'(CTR) was asserted in step 32. If this bit is a group 1 bit, then the complementary bit to that in step 32 is repetitively tested in step 44 until it is finally released. Upon release of the complementary group wire, the flow returns to the main loop.

If, however, the test 43 determines that the asserted bit is not group 0 so that E was asserted in step 32, then the assertion is reversed by a release 45 of the asserted line. Thereafter, a repetitive test 46 is made upon the complementary group wire until it is finally released at which point the flow returns to the beginning of the loop for reassertion of the same group wire.

Figure 4:
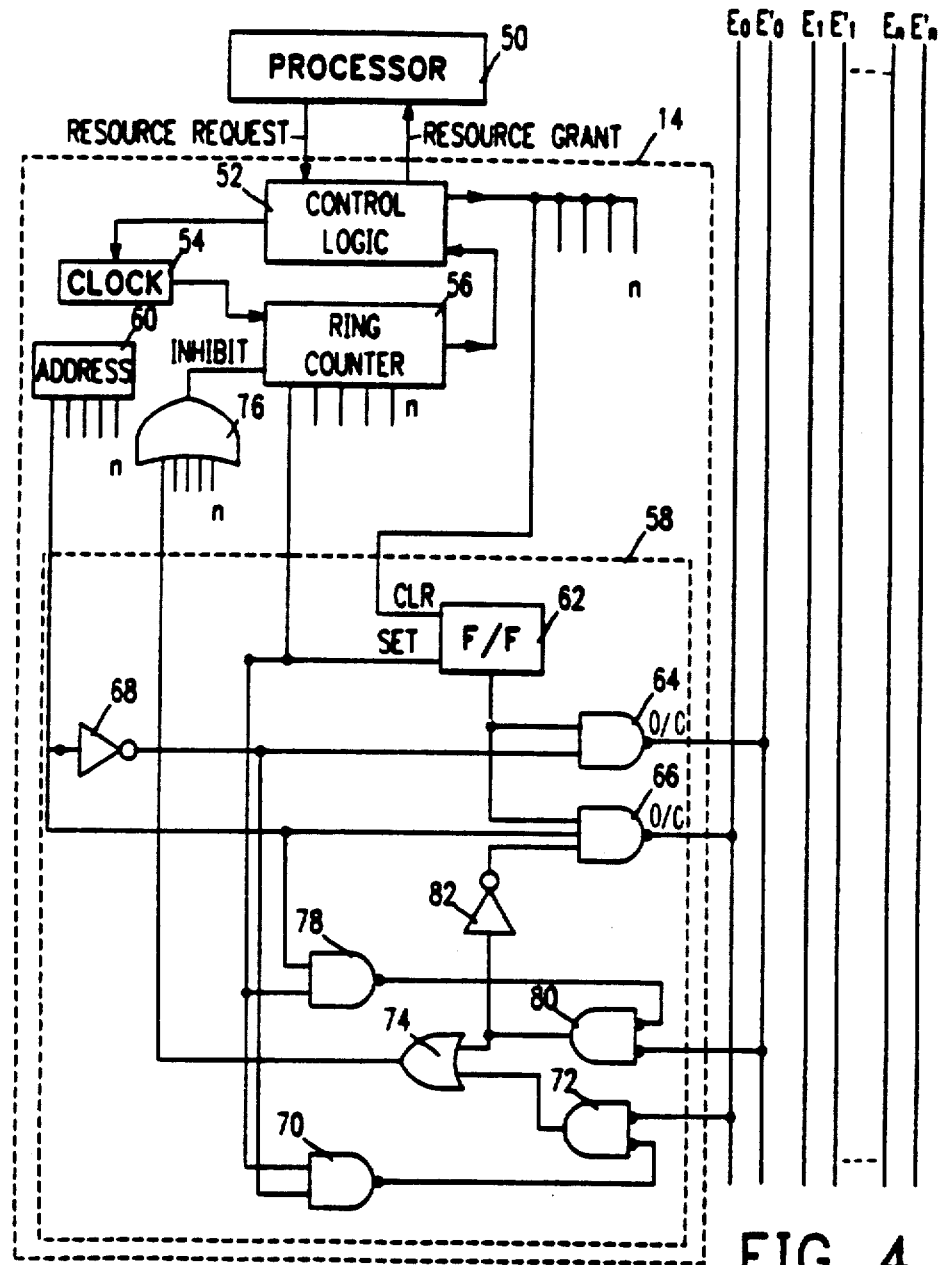
FIG. 4 is a schematic representation of the arbitration logic associated with each processor.

The arbitration logic 14 associated with the processor 50 is illustrated in FIG. 4. The group wires are arranged in n complementary pairs $E_0$, $E'_0$, $E_n$ and $E'_n$. Communication between the processor 50 and a control logic 52 of the arbitration logic 14 consists of one line by which the processor requests access to the resource and another line by which the arbitration logic 14 grants access to the resource to the processor 50. When the control logic 52 receives a request for the resource, it enables a clock 54. The period of the clock 54 is chosen to allow for the setting of the gates in the arbitration logic 14 and to allow for the propagation delay to all the other processors and back again. The clock 54 drives a ring counter 56 so that a number of outputs n equal to the number of bits in the address, that is, $n = \log_2 N$ where N is the number of processors. The ring counter 56 selects one of n logic sections 58. Each of the n logic sections 58 is associated with one bit of the address and with the corresponding group wires $E_j$ and $E'_j$. The least significant bit of the address is selected first, that is, the bit associated with the group wires $E_0$ and $E'_0$. The arbitration logic 14 also contains an address register 60 containing the address of the associated processor 50 and having n binary outputs.

Only one logic section 58 is illustrated in FIG. 4. The remaining logic sections are identical to section 58 except for the bit in the address with which they are associated and all resultant connections. The least significant output of the ring counter 56 sets a flip-flop 62 in the logic section 58. The output of the flip-flop 62 is connected to inputs of NAND gates 64 and 66 with open-collector outputs that are driving the group wires $E'_0$ and $E_0$ respectively. The least significant bit of the address register 60 is connected directly to another input of the NAND gate 66 and is also connected through an inverter 68 to another input of the NAND gate 64. As a result, if the least significant bit of the address is a zero, the NAND gate 64 is enabled, thus asserting the group wire $E'_0$. On the other hand, if the least significant bit is a 1, the NAND gate 66 is enabled, thereby asserting the group wire $E_0$. Either assertion is only done, of course, if the flip-flop 62 for the least significant bit has been selected by the ring counter 66.

If the least significant bit is a 0 so that $E'_0$ has been asserted, then the least significant bit and the output of the ring counter 56 are combined in the NAND gate 70 to enble the gate 72, which is a NOR gate operating as an AND gate with inverting inputs. The other input of the gate 72 is connected to the group wire $E_0$. Therefore, if the group wire $E'_0$ is asserted, the group wire $E_0$ is tested for assertion. If $E_0$ is asserted, the gate 72 outputs a true signal through an OR gate 74 to an n-input OR gate 76. The output of the n-input OR gate 76 is connected to an inhibit input of the ring counter 56 so that any true test for assertion will inhibit further connecting despite the continual running of the clock 54.

On the other hand, if the least significant bit is a 1 so that $E_0$ has been asserted, then the one least significant bit and the output of the ring counter 56 are combined in a NAND gate 78 to enable gate 80, also a NOR gate operating as an AND gate with inverting inputs. The other input of the gate 80 is connected to the group wire $E'_0$. As a result, if $E_0$ is asserted, then $E'_0$ is tested for assertion. If $E'_0$ is asserted, the gate 80 outputs a true signal through the OR gate 74 to the n-input OR gate 76 to thereby inhibit the ring counter 56. The output of the gate 80 is also connected to an input of the NAND gate 66, currently asserting the group wire $E_0$, through an inverter 82. As a result if $E_0$ is asserted and the $E'_0$ is found also to be asserted, the assertion of $E_0$ is released. When the group wire $E'_0$ is no longer asserted, that is, it is released by another processor, the NAND gate 66 almost immediately reaserts the group wire $E_0$. At the same time, the inhibition of the ring counter 56 is released.

The difference in the treatment of the two group wires $E_0$ and $E'_0$ is to be noted. If the group wire $E'_0$ is asserted and the complementary wire $E_0$ is found to be asserted as well, the assertion of the group wire $E'_0$ continues but the ring counter 56 is not allowed to increment until the complementary group wire is released. On the other hand, if the group one wire $E_0$ is asserted and the complementary group wire $E'_0$ is found to be aserted, not only is the ring counter 56 inhibited but also the original assertion of the group 1 wire $E_0$ is released until the complementary group wire $E'_0$ is released.

If, however, the test for the complementary group wire found the complementary wire to not be asserted, the ring counter 56 increments on the next pulse from the clock 54 and a similar asserting and testing is performed for the other bits of the address. After the ring counter 56 has selected all n logic sections 58, the next uninhibited count will cause an output to the control logic 52 to indicate that the resource is available so that the control logic 52 can grant access to the resource to the processor 50. When the procesor 50 finishes accessing the shared resource, the control logic 52 clears all the flip-flops 62 in all n-logic sections 58.

The ring counter 56 only selects one logic section 58 at a time and increments to the next logic section 58 only after a false test for assertion of the complementary group wire. If there are four bits in the address, the sequence of outputs of the ring counter will be: 0000, 0001, 0010, 0100, 1000 and 0000. One output indicates which of the logic sections 58 is currently selected while the last set of outputs 0000 coincides with the granting of the resource.

The advantage of the fixed priority arbitration, as described above, is the small number of shared variables, the 2n bus lines E and E' in the example, required to implement fully distributed arbitration.

Furthermore, if the outputs $E_i$ and $E'_i$ of the arbitration logic can be designed so as to prevent a failure in their asserted states, then failure of a processor or of its associated arbitration logic 14 will not affect the operation of the remainder of the multi-processor system. By proper design of the outputs of the arbitratiaon logic 14, this condition can be easily met and the distributed arbitration can be fault tolerant.

What has been described to this point is an arbitration scheme that utilizes a fixed priority in granting access to a shared resource. However, as previously discussed, fixed priority can be unfair in the respect that a high priority processor is always granted access to the shared resource to the exclusion of the lower priority processors. To remedy this drawback, the invention can be implemented with a fairness feature according to which once a processor has gained access to the shared resource, it must wait for the other queued requests to have their turn at the resource. The principle of this fairness feature is described as follows. As soon as a processor is serviced, it places itself into a group representing the most recently serviced processors. These processors cannot be serviced again unless all other processors waiting to be serviced have had their turn. Then the group of most recently serviced processors becomes eligible for service again and a new group of such processors is formed from the processors that are subsequently serviced.

By the use of open-collector outputs, the number of shared variables necessary to implement the fairness feature is reduced to four wires. Two shared variables $\overline{C}_0$ and $\overline{C}_1$, shown in FIG. 1 are connected to open-collector outputs of each of the arbitration logics 14 associated with the processors $P_0$–$P_7$. Each of the wires $\overline{C}_0$ and $\overline{C}_1$ is assigned to one of the fairness groups and indicates whether the respective fairness group is empty or non-empty. Another pair of shared variable control lines $\overline{T}_S$ and $\overline{T}_R$ are connected to the set and reset inputs of a flip-flop, called the turn flip-flop, in each of the processors $P_0$–$P_7$.

The control lines $\overline{T}_S$ and $\overline{T}_R$ are called the turn lines because they determine to which of the two fairness groups the current turn belongs. The signals on the turn lines are determined by open-collector outputs from the respective arbitration logics 14 attached to the processors $P_0$–$P_7$. Additionally, the arbitration logic 14 at each processor has an internal flip-flop, called the H flip-flop, which keeps a record of which group the processor currently belongs to.

Figure 5:
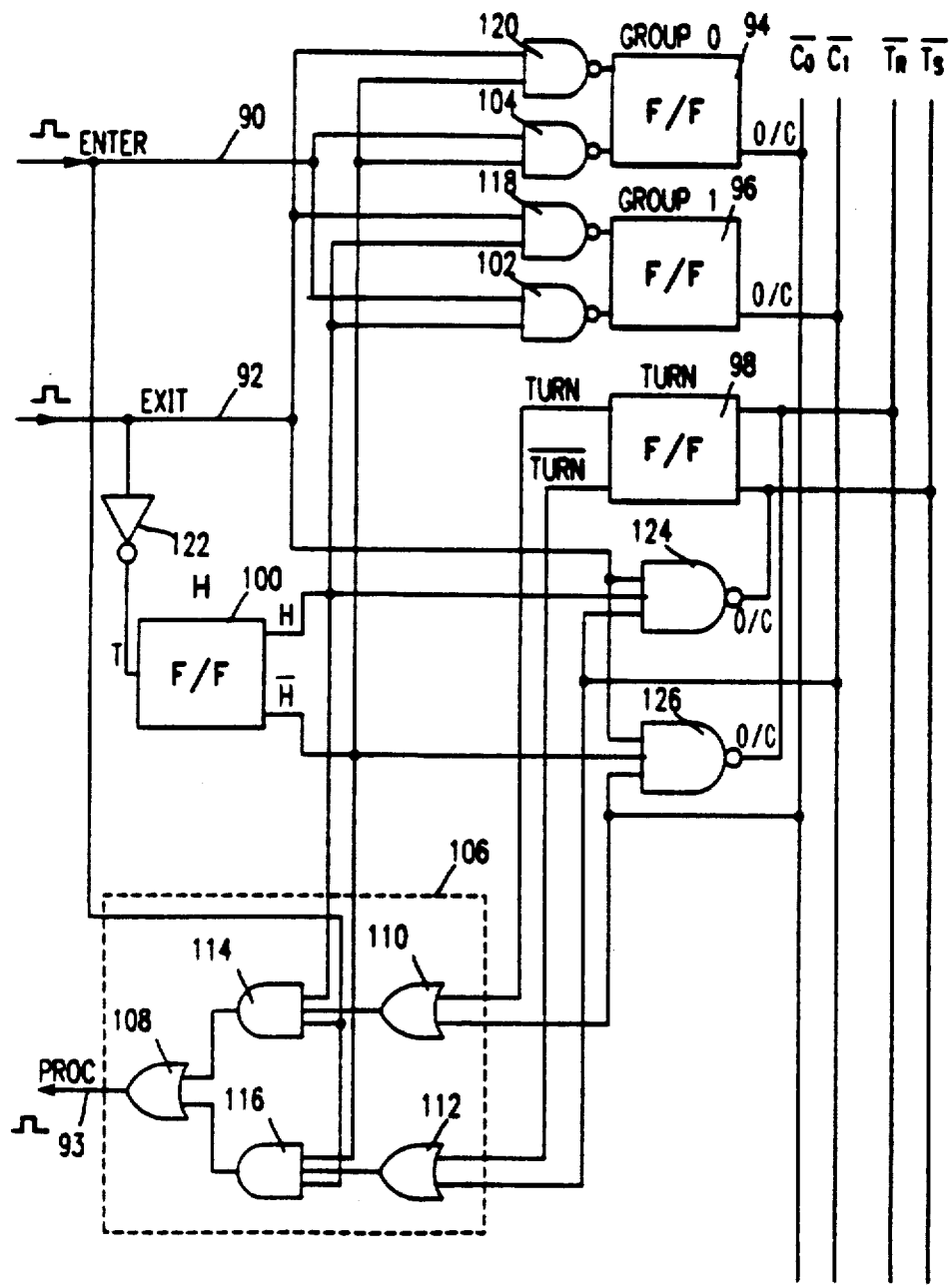
FIG. 5 is a schematic representation of the fairness circuitry of this invention.

A more detailed schematic of the part of the control logic that interfaces with the four fairness lines $\overline{C}_0$, $\overline{C}_1$, $\overline{T}_S$ and $\overline{T}_R$ is illustrated in FIG. 5.

There are three control lines linking the processor to its associated arbitration logic 14 for its fairness function. Two lines 90 and 92 provide the signals ENTER and EXIT respectively which indicate that the processor is entering arbitration, that is, requesting access to the shared resource, or exiting, that is, has completed access to the shared resource and is now resetting the arbitration logic 14 to reflect its departure. A third line 93 outputs a pulse PROC signal when the arbitration logic tells the processor to proceed with access, at least as far as fairness is concerned. The fairness group wire $\overline{C}_0$ is controlled by a group 0 flip-flop 94 with a complemented, open-collector output. Similarly, the fairness group wire $\overline{C}_1$ is controlled by a similar group 1 flip-flop 96.

A flip-flop 98 is the turn flip-flop and its complemented set input is connected to the set turn line $\overline{T}_S$ and its complemented reset input is connected to the reset turn line $\overline{T}_R$. The turn flip-flop 98 is thus set and reset by the turn lines common to all the processors. The output TURN of the turn flip-flop 94 indicates to which of the fairness groups, 0 or 1, the turn currently belongs. Yet another flip-flop 100 is the H flip-flop and its output is the fairness group, 0 or 1, to which the processor associated with this arbitration logic 14 currently belongs.

Upon entering arbitration, the pulsed ENTER signal sets either the group 0 flip-flop 94 or the group 1 flip-flop 96 depending upon the value of the H and from the H flip-flop 100. A true H enables a NAND gate 102 to pass the ENTER pulse to the complemented set input of the group 1 flip-flop 96 while $\overline{H}$ enables a NAND gate 104 to pass the ENTER pulse to the corresponding input of the group 0 flip-flop 94. When the group flip-flops 94 and 96 are set, they assert the respective fairness group lines $\overline{C}_0$ or $\overline{C}_1$.

The output PROC from the arbitration logic to the associated processor, indicating that it is the processor's turn, is controlled according to a functional relation of the following form: PROC=ENTER·(H·($\overline{C}_0$+TURN)+$\overline{H}$·($\overline{C}_1$+$\overline{\text{TURN}}$)).

This logical relation is accomplished by the logical circuit 106 comprising three OR gates 108, 110 and 112 and two AND gates 114 and 116 in the illustrated configuration. Thus the processor is granted access upon an ENTER signal if either its fairness group matches the turn or if no other processor of the opposite fairness group is currently requesting access and thus asserting the complementary fairness group line $\overline{C}_0$ or $\overline{C}_1$.

When a processor has been granted access and has completed access to the shared resource, the processor issues an EXIT pulse to the arbitration logic 14. The EXIT pulse resets the one of the group flip-flops 94 and 96 of the group to which the processor currently belongs. The H output of the flip-flop 100 enables a NAND gate 118 to pass the EXIT pulse to the complemented reset input of the group 1 flip-flop 96 while the $\overline{H}$ output enables a NAND gate 120 to pass the EXIT pulse to the corresponding input of the group 0 flip-flop 94. As a result of the resetting, the assertion of the group fairness line $\overline{C}_0$ or $\overline{C}_1$ is released. The EXIT pulse also passes through an inverter 122 to the H flip-flop 100 to thereby reverse its outputs, that is, the processor changes from one fairness group to the other. It should be noted that the delay introduced by the inverter 122 and the H flip-flop 100 allows the EXIT pulse to reset the group flip-flop 94 or 96 based on the previous group assingment before the same EXIT pulse reverses the group assignment. However, this requires that the H flip-flop 100 be edge triggered for a positive transition. Because of the inverter 122, the H flip-flop 100 will then trigger on the later or falling edge of the EXIT pulse.

The EXIT pulse also controls the TURN lines $\overline{T}_R$ and $\overline{T}_S$. NAND gate 124 with its open-collector output connected to the set turn line $\overline{T}_S$ is enabled by both the H output of the flip-flop 100 and the unasserted group 1 fairness line $\overline{C}_1$ to pass the EXIT pulse. That is, if the exiting processor belongs to a fairness group 1 and no other group 1 processors are requesting access and thereby asserting $\overline{C}_1$, the turn flip-flop 98 in each arbitration logic 14 is set. Similarly, a NAND gate 126 with its open-collector output connected to the reset turn line $\overline{T}_R$ passes the EXIT pulse enabled by $\overline{H}$ and a nonasserted $\overline{C}_0$. Thereby, an exiting group 0 processor resets each turn flip-flop 98 if no other group 0 processors are currently requesting access.

Figure 6:
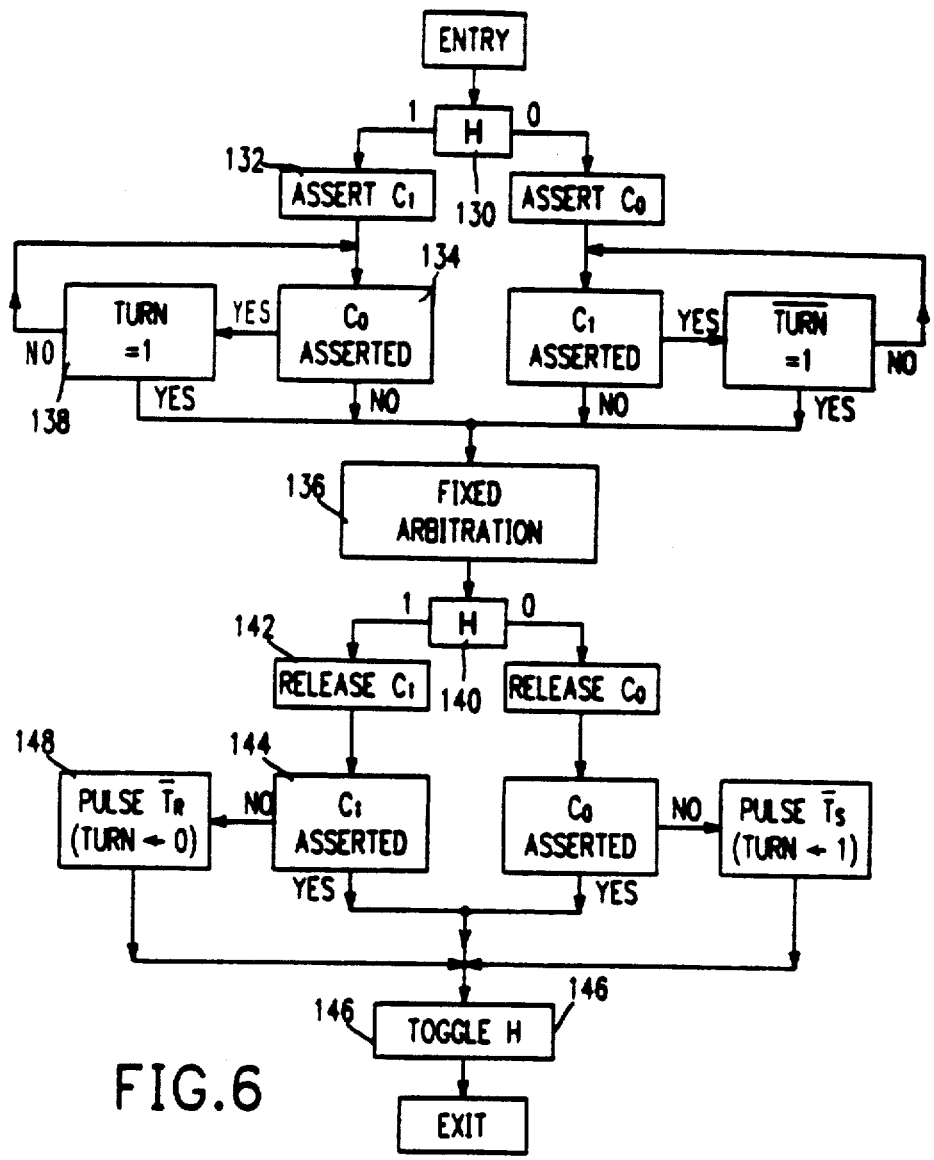
FIG. 6 is a flow diagram of arbitration with fairness according to this invention.

It is to be realized when fairness is combined with fixed priority arbiration as shown in FIG. 6 that the control lines between the processor and the arbitration logic shown in FIGS. 4 and 5 are modified in the following way. The resource request output from the processor is equivalent to the ENTER pulse signal of FIG. 5. The PROC pulse signal is equivalent to the resource request as received by the control logic 52 of FIG. 4. The EXIT pulse signal of FIG. 5 is issued from the processor 50 of FIG. 4 and is also used to clear the flip-flops 62.

If a failure to the input lines to the NAND gates 124 and 126 controlling the lines causes those lines to be grounded or if the outputs of the NAND gates 124 and 126 fail high, the failures will not affect the rest of the system.

The method of arbitration with fairness will now be described with reference to the flow diagram of FIG. 6, which illustrates the operation of the circuitry of FIG. 5. The arbitration logic 14 makes an initial test 130 of the value of its H flip-flop 100 to determine to which fairness group the processor currently belongs. If $H=1$, the processor belongs to fairness group 1 and operation proceeds for that fairness group. In the next step 132, the fairness group 1 processor asserts $\overline{C}_1$ indicating that the fairness group 1 has at least one processor belonging to the group. Then a test 134 is made of $\overline{C}_0$ to determine if it is asserted, that is, to see if the other fairness group is non-empty because processors belonging to that group are requesting access to the shared resource. If $\overline{C}_0 = 0$, the opposing fairness group is empty and the present processor is not barred from the resource because it has the wrong turn.

If this is the case, the current processor is issued the PROC signal and is allowed into the fixed priority arbitration 136 that was previously described with reference to the flow diagram in FIG. 3.

However, if the test 134 determines that $\overline{C}_0$ is asserted, then another test 138 is made to determine if the current turn belongs to fairness group 1 or TURN=1. If the test 138 is true, the turn belongs to the currently requesting processor and it is allowed into the fixed priority arbitration 136. However, if the test 138 is false, then the flow returns to the assertion test 134. Thus a processor is allowed into the fixed priority arbitration 138 if either no processor of the opposing fairness group is requesting access or if the turn belongs to the fairness group of the requesting processor.

If the test 130 for the fairness group of the requesting processor determines that it belongs to fairness group 0, then a corresponding series of steps is performed with the fairness groups reversed.

After a processor enters the fixed priority arbitration 136, it follows the previously described fixed priority arbitration which is illustrated in FIG. 3. Eventually the processor gains access to the shared resource and, after satisfying its requirements, exits the fixed priority arbitration 136 with an EXIT signal and begins a test 140 for the fairness group H to which the exiting processor currently belongs. If this processor belongs to fairness group 1, in the next step 142 it releases $\overline{C}_1$, that is, its arbitration logic no longer asserts the $\overline{C}_1$ group fairness line. Then a test 144 is performed to determine if $\overline{C}_1$ is asserted by any other processor of fairness group 1. If $\overline{C}_1$ is asserted, indicating that some other processor is asserting the $\overline{C}_1$ fairness line so that the fairness group 1 remains non-empty, the exiting processor proceeds to the final or group complementing step 146 of changing the contents of its own H flip-flop 100. Thereby, the exiting processor converts itself from fairness group 1 to fairness group 0. However, if the test 144 indicated that $\overline{C}_1$ is not asserted so that no other processors of fairness group 1 are asserting $\overline{C}_1$, then this last exiting member of that group first proceeds to a turn changing step 148 in which a pulse is sent to the turn set line $\overline{T}_S$. This pulse has the effect of setting the turn flip-flop 98 for each of the multiple processors. The result is that the last processor exiting a fairness group changes the turn to the other group. It should be noted that a processor may have entered the fixed priority arbitration 136 even though the turn belonged to the opposing fairness group because no processor of that opposing group was asserting its own fairness group line, that is not requesting access. In this case, the turn changing step 108 has no effect because setting an R/S flip-flop that is already in its set state has no effect. After the turn changing step 148, execution proceeds to the fairness group complementing step 146, after which the arbitration with fairness is completed.

If the test 130 for the current fairness group of the exiting processor determines that it belongs to a fairness group 0, then a series of steps is performed corresponding to those already described but with a reversal of the fairness group number and the turn value.

Although the invention has been described with the shared variables being wires connected to the arbitration logics associated with each processor, it is to be appreciated that an equivalent software implementation with the shared variables being memory locations.

What has been described is a distributed arbitration scheme for N multi-processors that use 2 $\log_2 N$ shared variables for fixed priority arbitration and an additional four variables for arbitration with fairness. Of course, the invention can be used for other system components than processors. In U.S. patent application, Ser. No. 554,653, filed on Oct. 24, 1983, one of the present inventors, C. J. Georgiou, describes a controller for a crosspoint switch interconnecting multiple communication lines. Each line enters the switch through a port and requests connection to another one of the lines. The present invention can be used for such a controller to arbitrate access to a port connection table, a memory that describes the status of all the ports.

Having thus described my invention, what I claim as new, and desire to secure by Letters Patent is:

1. A distributed method of arbitrating access to a shared resource among N stations that may request said access, comprising the steps of:
   - associating 2 $\log_2 N$ shared variables with each station in first and second sets of equal size, the association in either set being unique and defining a prioritization among said stations;
   - asserting at least one shared variable in said first set for a station requesting access;
   - examining at least one shared variable in said second set for assertion of said variables;
   - assigning access to said requesting station if all said variables of said second set are determined by said examination to be non-asserted;
   - releasing access of at least one variable of said first set if a variable of said second set determined by said examination to be asserted belongs to a second set of a station of higher priority.

2. A method of arbitrating access, as recited in claim 1, further comprising the steps of:
   - assigning each station to a first or a second group of said stations;
   - assigning a current turn to one of said groups;

preventing access of a station of one group if the current turn belongs to the other group unless no station of the other group is currently requesting access;

reversing the assignment of a station from one group to the other group when said station has completed access; and reversing the assignment of the current turn when no station of the same group as a station completing access is requesting access.

3. A distributed method of arbitrating access to a shared resource among N stations that may request access, comprising the steps of:

identifying each station with a unique address of $\log_2 N$ bits, each said bit having a first or second value;

associating one shared variable of both a first and a second set of $\log_2 N$ shared variables each with each bit location of said address, the two shared variables associated with a bit location being complementary variables, said shared variables being assertable by a plurality of stations, a shared variable being asserted if any station asserts said variable and being non-asserted if no station asserts shared variable;

requesting access for a station;

asserting the shared variable associated with a bit location of the set having the same set number as the bit value number of the bit location of the station for which access is requested;

examining for an asserted state the shared variable complementary to the asserted shared variable;

releasing said asserted shared variable if the examined complementary shared variable is asserted and said asserted variable is a member of said first set;

waiting for release of a complementary shared variable if said examined shared variable is asserted and is a member of said first set;

granting access to said station when $\log_2 N$ shared variables have been asserted and all shared variables complementary to said asserted shared variables have been determined to be non-asserted, whereby access is prioritized according to said addresses.

4. A method of arbitrating as recited in claim 3, wherein said steps of asserting, examining, releasing and waiting are sequentially performed for each bit location.

5. A method of arbitrating as recited in claim 3, wherein said step of asserting comprises impressing an electrical signal upon an electrical line, said line being said shared variable; and said step of examining comprises measuring the voltage on said electrical line.

6. A method of arbitrating as recited in claim 5, wherein said electrical signal is impressed through an open-collector output.

7. A method of arbitrating access with fairness as recited in claim 3, further comprising the steps of:

assigning each station to a fairness group;

assigning a turn to one of said fairness groups;

asserting one of two fairness shared variables associated with the fairness group to which a station requesting access is assigned, an asserted fairness shared variable indicating that a station assigned to the fairness group associated with said asserted variable is requesting access;

comparing the fairness group to which said station requesting access is assigned to the fairness group to which the turn belongs;

allowing access to said resource only if the turn belongs to the fairness group of the station requesting access or if the shared variable of the fairness group other than the fairness group requesting access is not asserted;

changing the fairness group assignment of a station completing access; and changing said turn to the other of said fairness groups if the fairness group variable associated with the fairness group of a station completing access is not asserted.

8. A method of arbitrating access with fairness as recited in claim 7, further comprising the step of providing registers for storing therein a turn identification, said registers being associated with each station that can be changed by said shared variable determining said turn.

9. A method of arbitrating access with fairness, as recited in claim 8, wherein said step of asserting of said variables and changing said turn impress an electrical signal on an electrical line, said electrical lines being said shared variable.

10. A method of arbitrating access with fairness, as recited in claim 9, wherein said electrical signal is impressed through an open-collector output.

11. A method of arbitrating fairness for access to a shared resource for one of multiple stations requesting said access, each said station being associated with separate means for asserting two fairness shared variables, for examining the asserted state of said variables, and for controlling two turn variables, said shared variables being associated with all said stations, each said fairness shared variable upon being asserted indicating that a station assigned to the fairness group associated with said asserted fairness shared variable is requesting access, said turn shared variables determining a turn belonging to one of said fairness groups, comprising the steps of:

assigning each station to a fairness group;

assigning the turn to one of said fairness group;

asserting the shared variable associated with the fairness group to which a station requesting access is assigned;

comparing the fairness group to which said station requesting access is assigned to the fairness group to which the turn belongs;

allowing access to said resource only if the turn belongs to the fairness group of the station requesting access or if the shared variable of the fairness group other than the fairness group requesting access is not asserted;

changing the fairness group assignment of a station completing access; and changing the turn if the fairness group variable associated with the fairness group of a station completing access is not asserted.

12. A method of arbitrating access with fairness as recited in claim 11, wherein the step of changing said turn comprises changing a turn identification stored in a register associated with each station, all said resigters being changed.

13. A method of arbitrating access with fairness, as recited in claim 12, wherein said step of asserting of said variables and changing said turn impress an electrical signal on an electrical line, said electrical lines being said shared variable.

14. A method of arbitrating access with fairness, as recited in claim 13, wherein said electrical signal is impressed through an open-collector output.

15. A distributed arbiter for N stations potentially requesting access to a shared resource, comprising:
- $2 \log_2 N$ shared variables connected to all N stations, said variables divided into a first and a second set of equal size, the shared variables of said two sets being complementary, one variable of each set being associated with each bit of a $\log_2 N$ identification unique to each station, each bit having a first or a second value;
- means separately associated with each station for asserting said shared variables of said first set associated with the bits of the identification of said station having said first value and for asserting said shared variables of said second set associated with the bits of the identification of said station having said second value;
- means separately associated with each station for examining the asserted state of the shared variables complementary to the shared variables asserted by the asserting means;
- means associated with each said station for releasing the assertion of a shared variable of said first set asserted by said station when the complementary shared variable of said asserted shared variable is determined by said examining means to be asserted;
- means associated with each said station for waiting for the release of a shared variable determined by said examining means to be asserted, said shared variable determined to be asserted being complementary to a shared variable of said second set asserted by said station; and
- means associated with each said station for providing access to said shared resource to said station when $\log_2 N$ shared variables have been asserted and the shared variable complementary to said asserted shared variables have been determined by said examining means to be non-asserted.

16. A distributed arbiter as recited in claim 15, wherein said shared variables are electrical lines and said asserting and releasing means include open-collector outputs.

17. A distributed arbiter with fairness as recited in claim 15, further comprising:
- two turn shared variables associated with first and second fairness groups;
- turn identifying means for identifying a turn assigned to either of said fairness groups;
- means separately associated with each said station for assigning said station to either of said fairness groups;
- means separately associated with each said station for asserting the turn variable associated with the fairness group to which said station is assigned;
- means separately associated with each station for examining the turn variable other than that associated with the fairness group to which said station is assigned; and
- means separately associated with each said station for releasing said asserted turn variable when said examined shared variable is determined to be asserted and the turn is not assigned to the fairness group of said station.

18. A distributed arbiter with fairness as recited in claim 17, further comprising:
- means associated with each said station for changing the identification of said turn identifying means in all said stations.

* * * * *